(12) United States Patent
Sun et al.

(10) Patent No.: US 8,559,540 B2
(45) Date of Patent: Oct. 15, 2013

(54) APPARATUS AND METHOD FOR TRELLIS-BASED DETECTION IN A COMMUNICATION SYSTEM

(75) Inventors: Yang Sun, Houston, TX (US); Joseph R. Cavallaro, Pearland, TX (US); Jorma Lilleberg, Oulu (FI)

(73) Assignee: Nokia Corporation, Espoo (FI)

( * ) Notice: Subject to any disclaimer, the term of this patent is extended or adjusted under 35 U.S.C. 154(b) by 472 days.

(21) Appl. No.: 12/904,622

(22) Filed: Oct. 14, 2010

(65) Prior Publication Data

US 2012/0093266 A1  Apr. 19, 2012

(51) Int. Cl.
 H04L 5/12 (2006.01)
 H04L 27/06 (2006.01)
 H03M 13/03 (2006.01)

(52) U.S. Cl.
 USPC .......................... 375/265; 375/341; 714/792

(58) Field of Classification Search
 USPC ......... 375/259, 260, 261, 262, 263, 264, 265, 375/316, 340, 341; 714/699, 746, 786, 792, 714/794, 795, 796; 704/242; 708/100, 200, 708/270, 277
 See application file for complete search history.

(56) References Cited

U.S. PATENT DOCUMENTS 7,127,664 B2 * 10/2006 Nicol et al. ................. 714/792
7,593,489 B2   9/2009 Koshy et al.
2004/0044946 A1 *  3/2004 Bickerstaff et al. .......... 714/792
2007/0055919 A1 *  3/2007 Li et al. ...................... 714/755
2008/0285671 A1   11/2008 Sundberg et al.

OTHER PUBLICATIONS

Hochwald et al., "Achieving Near-Capacity on a Multiple-Antenna Channel," IEEE Transactions on Communications, vol. 51, No. 3, Mar. 2003.
Studer et al., "Soft-Output Sphere Decoding: Algorithms and VLSI Implementation," IEEE Journal on Selected Areas in Communications, vol. 26, No. 2, Feb. 2008.
Garrett et al., "Silicon Complexity for Maximum Likelihood MIMO Detection Using Spherical Decoding," IEEE Journal of Solid-State Circuits, vol. 39, No. 9, Sep. 2004.
Kim et al., "Design Tradeoffs and Hardware Architecture for Real-Time Iterative MIMO Detection using Sphere Decoding and LDPC Coding," IEEE Journal on Selected Areas in Communications, vol. 26, No. 6, Aug. 2008.

(Continued)

Primary Examiner — Sam K Ahn
Assistant Examiner — Vineeta Panwalkar
(74) Attorney, Agent, or Firm — Squire Sanders (US) LLP

(57) ABSTRACT

An apparatus for trellis-based detection in a communication system including a processor and memory having computer program code configured to construct a trellis representing a transmitted signal formed from a plurality of symbols, each having a constellation size, transmitted by a number of transmit antennas, and form a log likelihood ratio at nodes of the trellis as a log-sum of a number of exponential terms corresponding to a hypothesized transmitted bit value of the plurality of symbols. The number of exponential terms is limited by a number of most likely paths of the trellis extending from each node of the trellis and the constellation size. The processor and memory including computer program code are further configured to form a list at each node of the trellis of a size limited to the number of the most likely paths of the trellis extending from each node of the trellis.

20 Claims, 13 Drawing Sheets

(56) References Cited

OTHER PUBLICATIONS

"3$^{rd}$ Generation Partnership Project; Technical Specification Group Radio Access Network; Evolved Universal Terrestrial Radio Access (E-UTRA) and Evolved Universal Terrestrial Radio Access Network (E-UTRAN); Overall description; Stage 2 (Release 8)", 3GPP TS 36.300, V8.7.0, Techinical Specification, Dec. 2008, 144 pages.

"3$^{rd}$ Generation Partnership Project; Technical Specification Group Radio Access Network; Radio Resource Control (RRC); Protocol Specification (Release 9)", 3GPP TS 25.331, V9.1.0, Dec. 2009, 233 pages.

"3$^{rd}$ Generation Partnership Project; Technical Specification Group Radio Access Network; Evolved Universal Terrestrial Radio Access (E-UTRA) Radio Resource Control (RRC); Protocol specification (Release 9)", 3GPP TS 36.331, V9.1.0, Dec. 2009, 1759 pages.

"3$^{rd}$ Generation Partnership Project; Techinical Specification Group Services and System Aspects; Telecommunication management; Home enhanced Node B (HeNB) Subsystem (HeNS); Network Resource Model (NRM); Integration Reference Point (IRP); Requirements (Release 9)", 3GPP TS 32.781, V9.1.0, Mar. 2010, 9 pages.

Wu et al., "Reconfigurable Real-time MIMO Detector on GPU," IEEE, Rice University, Houston, Texas, Asilomar, 2009, pp. 690-694.

Sun et al., "Low-Complexity and High-Performance Soft MIMO Detection Based on Distributed M-Algorithm Through Trellis-Diagram," IEEE, Rice University, Houston, Texas, ICASSP, 2010, pp. 3398-3401.

* cited by examiner

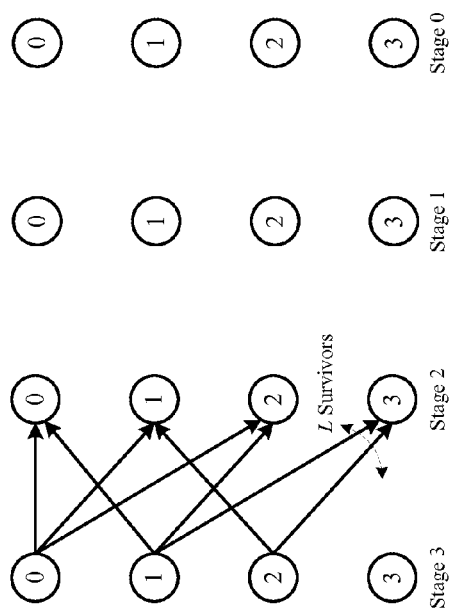
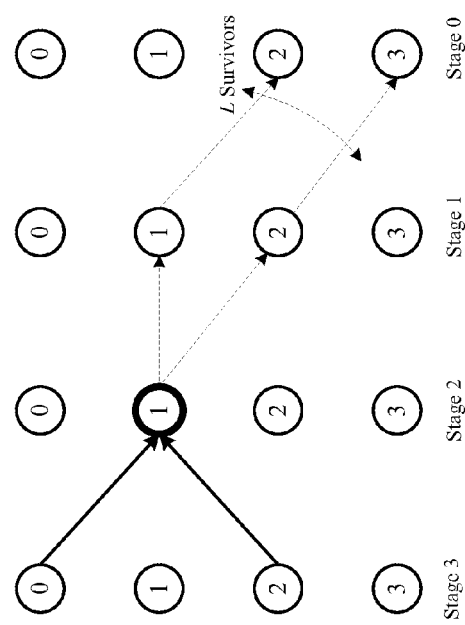
FIGURE 10A
FIGURE 10B

APPARATUS AND METHOD FOR TRELLIS-BASED DETECTION IN A COMMUNICATION SYSTEM

TECHNICAL FIELD

The present invention is directed, in general, to communication systems and, in particular, to an apparatus, method and system for trellis-based detection in a communication system.

BACKGROUND

Long term evolution ("LTE") of the Third Generation Partnership Project ("3GPP"), also referred to as 3GPP LTE, refers to research and development involving the 3GPP LTE Release 8 and beyond, which is the name generally used to describe an ongoing effort across the industry aimed at identifying technologies and capabilities that can improve systems such as the universal mobile telecommunication system ("UMTS"). The notation "LTE-A" is generally used in the industry to refer to further advancements in LTE. The goals of this broadly based project include improving communication efficiency, lowering costs, improving services, making use of new spectrum opportunities, and achieving better integration with other open standards.

The evolved universal terrestrial radio access network ("E-UTRAN") in 3GPP includes base stations providing user plane (including packet data convergence protocol/radio link control/media access control/physical ("PDCP/RLC/MAC/PHY") sublayers) and control plane (including a radio resource control ("RRC") sublayer) protocol terminations towards wireless communication devices such as cellular telephones. A wireless communication device or terminal is generally known as user equipment (also referred to as "UE"). A base station is an entity of a communication network often referred to as a Node B or an NB. Particularly in the E-UTRAN, an "evolved" base station is referred to as an eNodeB or an eNB. For details about the overall architecture of the E-UTRAN, see 3GPP Technical Specification ("TS") 36.300 v8.7.0 (2008-12), which is incorporated herein by reference. For details of the communication or radio resource control management, see 3GPP TS 25.331 v.9.1.0 (2009-12) and 3GPP TS 36.331 v.9.1.0 (2009-12), which are incorporated herein by reference.

As wireless radio communication systems such as cellular telephone, satellite, and microwave communication systems become widely deployed and continue to attract a growing number of users, there is a pressing need to accommodate a large and variable amount of communication traffic with a minimal amount of processing resources, particularly in a mobile transceiver in wireless communication devices powered by a small battery. The increased quantity of data is a consequence of wireless communication devices transmitting video information and surfing the Internet, as well as performing ordinary voice communications.

One bottleneck in such communication systems is the need to process a large amount of data received at one end of a digital communication channel to detect a noisy signal transmitted substantially simultaneously by a plurality of transmit antennas, and which may be received substantially simultaneously by a plurality of receive antennas. Such communication channels that employ multiple antennas at either end are generally referred to as multi-input, multi-output ("MIMO") communication channels.

Optimum soft MIMO wireless channel detection is conventionally based on Log-Maximum A Posteriori Probability ("Log-MAP") detection, which is too computationally intensive to be implemented in a practical MIMO receiver (or transceiver), because the Log-MAP procedure requires calculating a log-sum of $Q^M/2$ exponential terms, wherein Q is the constellation size (i.e., the number of possible symbols of a modulation alphabet of a transmitted signal), and M is the number of transmit antennas. A brute-force implementation of an optimum Log-MAP procedure consumes enormous computing power, which makes it impractical to be employed in multiple antenna systems with higher-order modulation schemes. In practice, the Log-MAP procedure is often approximated by the Max-Log-MAP procedure to reduce computational complexity. The sub-optimal Max-Log-MAP approximation to the Log-MAP procedure, however, has a significant performance loss compared to the optimal Log-MAP procedure and, thus, there remains a significant performance gap between the sub-optimum Max-Log-MAP approximation and the optimal Log-MAP procedure. Existing MIMO detection implementations are based on the sub-optimal Max-Log-MAP approximation, which limits their error performance.

Therefore there is a need to develop a reduced-complexity replacement for the Log-MAP procedure for detection in a high-performance communication device that avoids the deficiencies of current communication systems.

SUMMARY OF THE INVENTION

These and other problems are generally solved or circumvented, and technical advantages are generally achieved, by embodiments of the present invention, which include an apparatus, method and system for trellis-based detection in a communication system. In one embodiment, an apparatus includes a processor and memory including computer program code. The memory and the computer program code are configured to, with the processor, cause the apparatus to construct a trellis representing a transmitted signal formed from a plurality of symbols transmitted by a number of transmit antennas, wherein each symbol has a constellation size. The trellis is formed of columns representing the number of transmit antennas and rows representing values of the plurality of symbols with nodes at intersections thereof. The memory and the computer program code are further configured to, with the processor, cause the apparatus to form a log likelihood ratio at the nodes of the trellis as a log-sum of a number of exponential terms corresponding to a hypothesized transmitted bit value of 0 or 1 of the plurality of symbols. The number of exponential terms is limited by a function of a number of most likely paths of the trellis extending from each node of the trellis and the constellation size. The memory and the computer program code are further configured to, with the processor, cause the apparatus to form a list at each node of the trellis of a size limited to the number of the most likely paths of the trellis extending from each node of the trellis.

The foregoing has outlined rather broadly the features and technical advantages of the present invention in order that the detailed description of the invention that follows may be better understood. Additional features and advantages of the invention will be described hereinafter, which form the subject of the claims of the invention. It should be appreciated by those skilled in the art that the conception and specific embodiment disclosed may be readily utilized as a basis for modifying or designing other structures or processes for carrying out the same purposes of the present invention. It should also be realized by those skilled in the art that such equivalent constructions do not depart from the spirit and scope of the invention as set forth in the appended claims.

BRIEF DESCRIPTION OF THE DRAWINGS

For a more complete understanding of the invention, and the advantages thereof, reference is now made to the following descriptions taken in conjunction with the accompanying drawings, in which:

FIG. 10 illustrates a path extension example where L=2 shortest paths are found for a node, constructed according to the principles of the invention;

DETAILED DESCRIPTION OF ILLUSTRATIVE EMBODIMENTS

The making and using of the presently preferred embodiments are discussed in detail below. It should be appreciated, however, that the present invention provides many applicable inventive concepts that can be embodied in a wide variety of specific contexts. The specific embodiments discussed are merely illustrative of specific ways to make and use the invention, and do not limit the scope of the invention. In view of the foregoing, the present invention will be described with respect to exemplary embodiments in a specific context of an apparatus, method and system for trellis-based detection in a communication system. The apparatus, method and system are applicable, without limitation, to any communication system including existing and future 3GPP technologies such as UMTS, LTE and its future variants such as 4th generation ("4G") communication systems.

Figure 1:
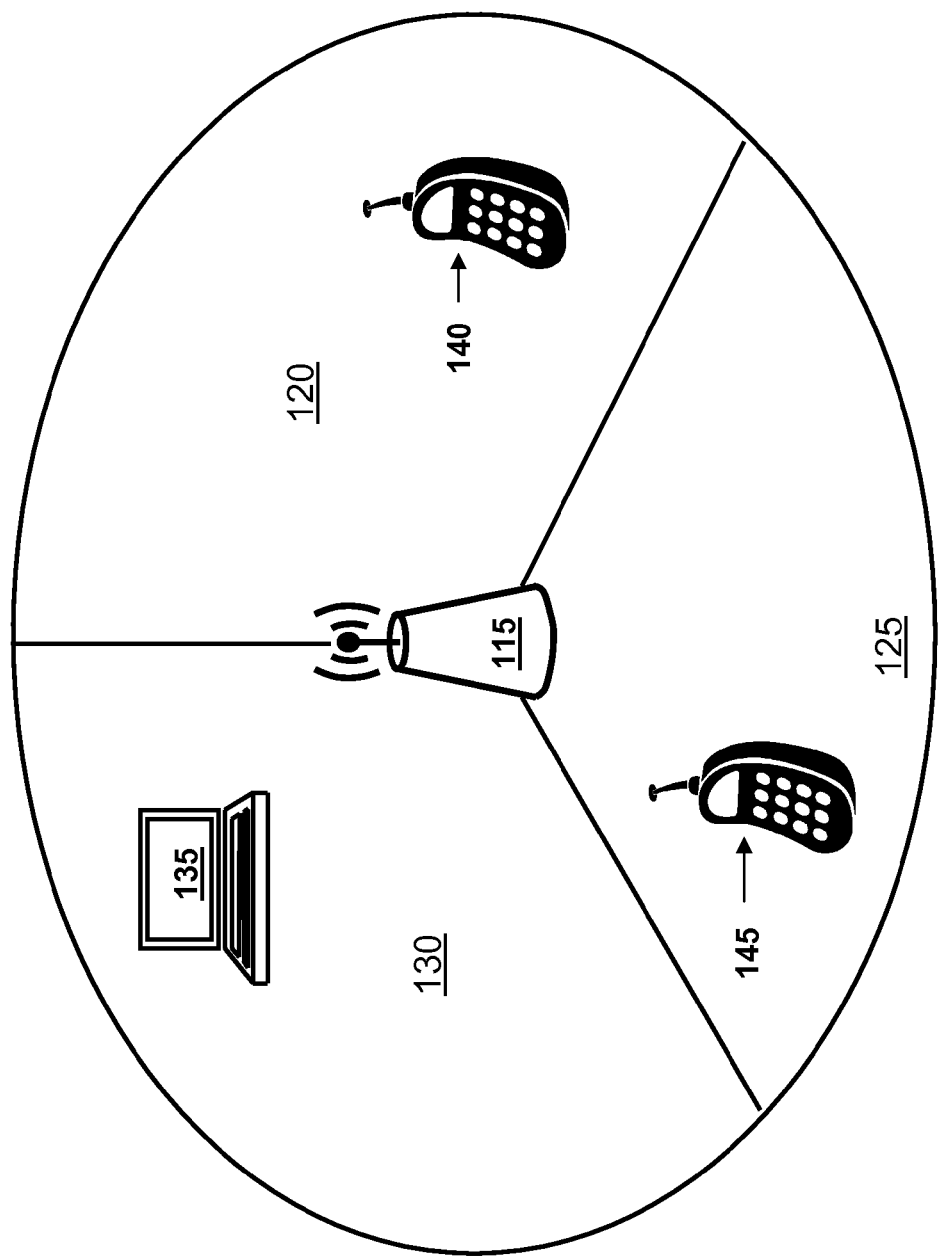
FIGS. 1 and 2 illustrate system level diagrams of embodiments of communication systems including a base station and wireless communication devices that provide an environment for application of the principles of the present invention.

Turning now to FIG. 1, illustrated is a system level diagram of an embodiment of a communication system including a base station 115 and wireless communication devices (e.g., user equipment) 135, 140, 145 that provides an environment for application of the principles of the present invention. The base station 115 is coupled to a public switched telephone network (not shown). The base station 115 is configured with a plurality of antennas to transmit and receive signals in a plurality of sectors including a first sector 120, a second sector 125, and a third sector 130, each of which typically spans 120 degrees. The three sectors or more than three sectors are configured per frequency, and one base station 115 can support more than one frequency. Although FIG. 1 illustrates one wireless communication device (e.g., wireless communication device 140) in each sector (e.g. the first sector 120), a sector (e.g. the first sector 120) may generally contain a plurality of wireless communication devices. In an alternative embodiment, a base station 115 may be formed with only one sector (e.g. the first sector 120), and multiple base stations may be constructed to transmit according to co-operative multi-input/multi-output ("C-MIMO") operation, etc.

The sectors (e.g. the first sector 120) are formed by focusing and phasing radiated signals from the base station antennas, and separate antennas may be employed per sector (e.g. the first sector 120). The plurality of sectors 120, 125, 130 increases the number of subscriber stations (e.g., the wireless communication devices 135, 140, 145) that can simultaneously communicate with the base station 115 without the need to increase the utilized bandwidth by reduction of interference that results from focusing and phasing base station antennas. While the wireless communication devices 135, 140, 145 are part of a primary communication system, the wireless communication devices 135, 140, 145 and other devices such as machines (not shown) may be a part of a secondary communication system to participate in, without limitation, D2D and machine-to-machine communications or other communications. Additionally, the wireless communication devices 135, 140, 145 may form communication nodes along with other devices in the communication system.

Figure 2:
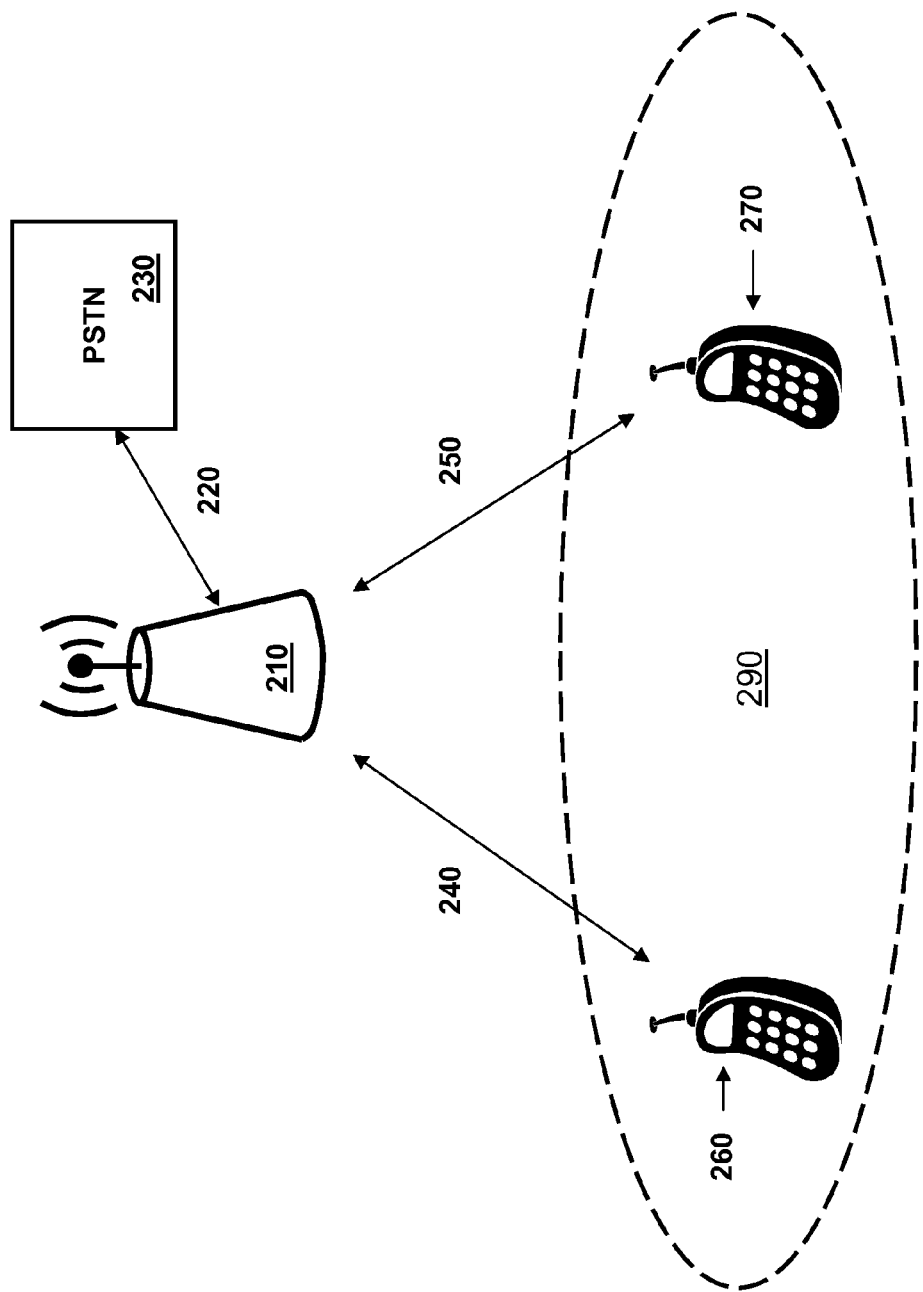

Turning now to FIG. 2, illustrated is a system level diagram of an embodiment of a communication system including a base station 210 and wireless communication devices (e.g., user equipment) 260, 270 that provides an environment for application of the principles of the present invention. The communication system includes the base station 210 coupled by communication path or link 220 (e.g., by a fiber-optic communication path) to a core telecommunications network such as public switched telephone network ("PSTN") 230. The base station 210 is coupled by wireless communication paths or links 240, 250 to the wireless communication devices 260, 270, respectively, that lie within its cellular area 290.

In operation of the communication system illustrated in FIG. 2, the base station 210 communicates with each wireless communication device 260, 270 through control and data communication resources allocated by the base station 210 over the communication paths 240, 250, respectively. The control and data communication resources may include frequency and time-slot communication resources in frequency division duplex ("FDD") and/or time division duplex ("TDD") communication modes. While the wireless communication devices 260, 270 are part of a primary communication system, the wireless communication devices 260, 270 and other devices such as machines (not shown) may be a part of a secondary communication system to participate in, without limitation, device-to-device and machine-to-machine communications or other communications. Additionally, the wireless communication devices 260, 270 may form communication nodes along with other devices in the communication system.

Figure 3:
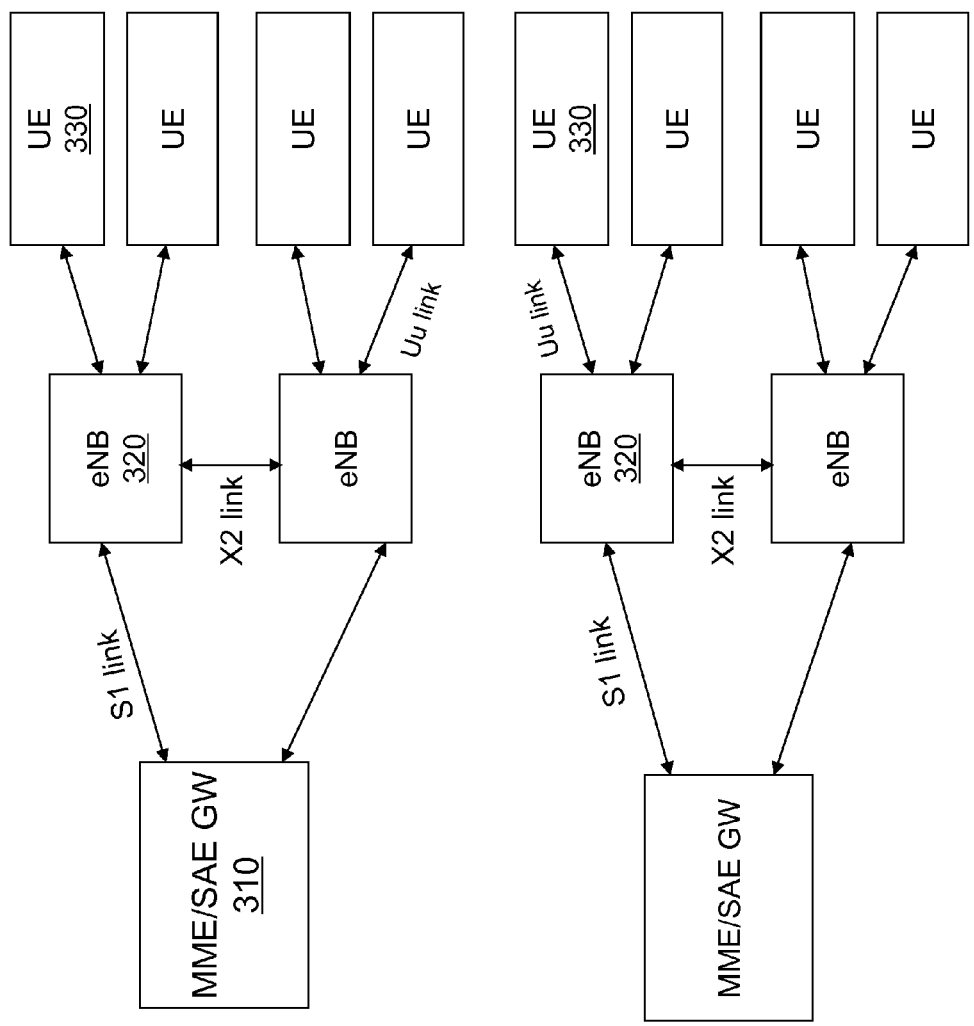
FIGS. 3 and 4 illustrate system level diagrams of embodiments of communication systems including wireless communication systems that provide an environment for application of the principles of the present invention.

Turning now to FIG. 3, illustrated is a system level diagram of an embodiment of a communication system including a wireless communication system that provides an environment for the application of the principles of the present invention. The wireless communication system may be configured to provide evolved UMTS terrestrial radio access network ("E-UTRAN") universal mobile telecommunications services. A mobile management entity/system architecture evolution gateway ("MME/SAE GW," one of which is designated 310) provides control functionality for an E-UTRAN node B (designated "eNB," an "evolved node B," also referred to as a "base station," one of which is designated 320) via an S1 communication link (ones of which are designated "S1 link"). The base stations 320 communicate via X2 communication links (ones of which are designated "X2 link"). The various communication links are typically fiber, microwave, or other high-frequency communication paths such as coaxial links, or combinations thereof.

The base stations 320 communicate with wireless communication devices such as user equipment ("UE," ones of which are designated 330), which is typically a mobile transceiver carried by a user. Thus, the communication links (designated "Uu" communication links, ones of which are designated "Uu link") coupling the base stations 320 to the user equipment 330 are air links employing a wireless communication signal such as, for example, an orthogonal frequency division multiplex ("OFDM") signal. While the user equipment 330 are part of a primary communication system, the user equipment 330 and other devices such as machines (not shown) may be a part of a secondary communication system to participate in, without limitation, D2D and machine-to-machine communications or other communications. Additionally, the user equipment 330 may form a communication node along with other devices in the communication system.

Figure 4:
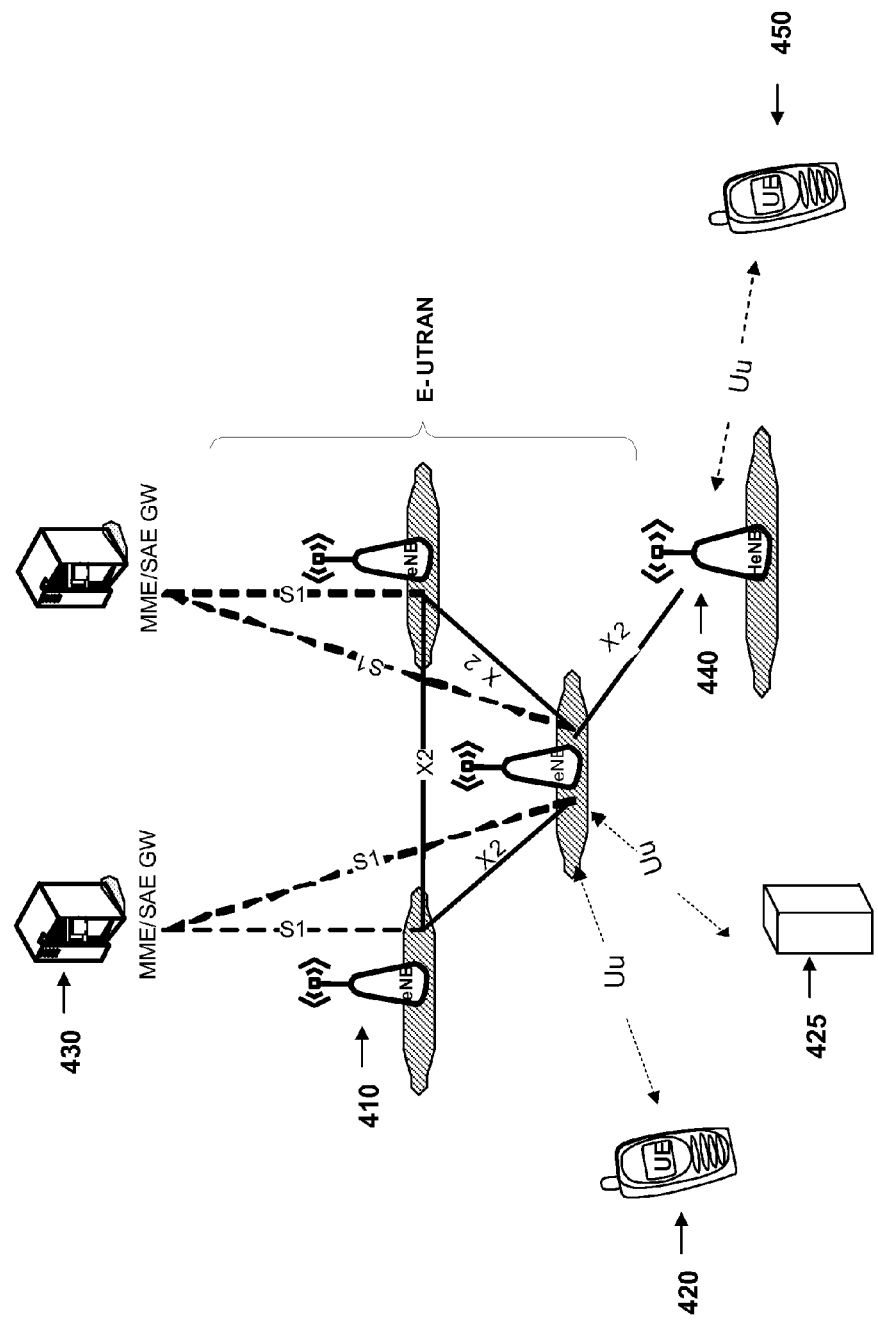

Turning now to FIG. 4, illustrated is a system level diagram of an embodiment of a communication system including a wireless communication system that provides an environment for the application of the principles of the present invention. The wireless communication system provides an E-UTRAN architecture including base stations (one of which is designated 410) providing E-UTRAN user plane (packet data convergence protocol/radio link control/media access control/physical) and control plane (radio resource control) protocol terminations towards wireless communication devices such as user equipment 420 and other devices such as machines 425 (e.g., an appliance, television, meter, etc.). The base stations 410 are interconnected with X2 interfaces or communication links (designated "X2") and are connected to the wireless communication devices such as user equipment 420 and other devices such as machines 425 via Uu interfaces or communication links (designated "Uu"). The base stations 410 are also connected by S1 interfaces or communication links (designated "S1") to an evolved packet core ("EPC") including a mobile management entity/system architecture evolution gateway ("MME/SAE GW," one of which is designated 430). The S1 interface supports a multiple entity relationship between the mobile management entity/system architecture evolution gateway 430 and the base stations 410. For applications supporting inter-public land mobile handover, inter-eNB active mode mobility is supported by the mobile management entity/system architecture evolution gateway 430 relocation via the S1 interface.

The base stations 410 may host functions such as radio resource management. For instance, the base stations 410 may perform functions such as Internet protocol ("IP") header compression and encryption of user data streams, ciphering of user data streams, radio bearer control, radio admission control, connection mobility control, dynamic allocation of communication resources to user equipment in both the uplink and the downlink, selection of a mobility management entity at the user equipment attachment, routing of user plane data towards the user plane entity, scheduling and transmission of paging messages (originated from the mobility management entity), scheduling and transmission of broadcast information (originated from the mobility management entity or operations and maintenance), and measurement and reporting configuration for mobility and scheduling. The mobile management entity/system architecture evolution gateway 430 may host functions such as distribution of paging messages to the base stations 410, security control, termination of user plane packets for paging reasons, switching of user plane for support of the user equipment mobility, idle state mobility control, and system architecture evolution bearer control. The user equipment 420 and machines 425 receive an allocation of a group of information blocks from the base stations 410.

Additionally, the ones of the base stations 410 are coupled to a home base station 440 (a device), which is coupled to devices such as user equipment 450 and/or machines (not shown) for a secondary communication system. The base station 410 can allocate secondary communication system resources directly to the user equipment 450 and machines, or to the home base station 440 for communications (e.g., local or D2D communications) within the secondary communication system. The secondary communication resources can overlap with communication resources employed by the base station 410 to communicate with the user equipment 420 within its serving area. For a better understanding of home base stations (designated "HeNB"), see 3 GPP TS 32.781 v.9.1.0 (2010-03), which is incorporated herein by reference. While the user equipment 420 and machines 425 are part of a primary communication system, the user equipment 420, machines 425 and home base station 440 (communicating with other user equipment 450 and machines (not shown)) may be a part of a secondary communication system to participate in, without limitation, D2D and machine-to-machine communications or other communications. Additionally, the user equipment 420 and machines 425 may form communication nodes along with other devices in the communication system.

Figure 5:
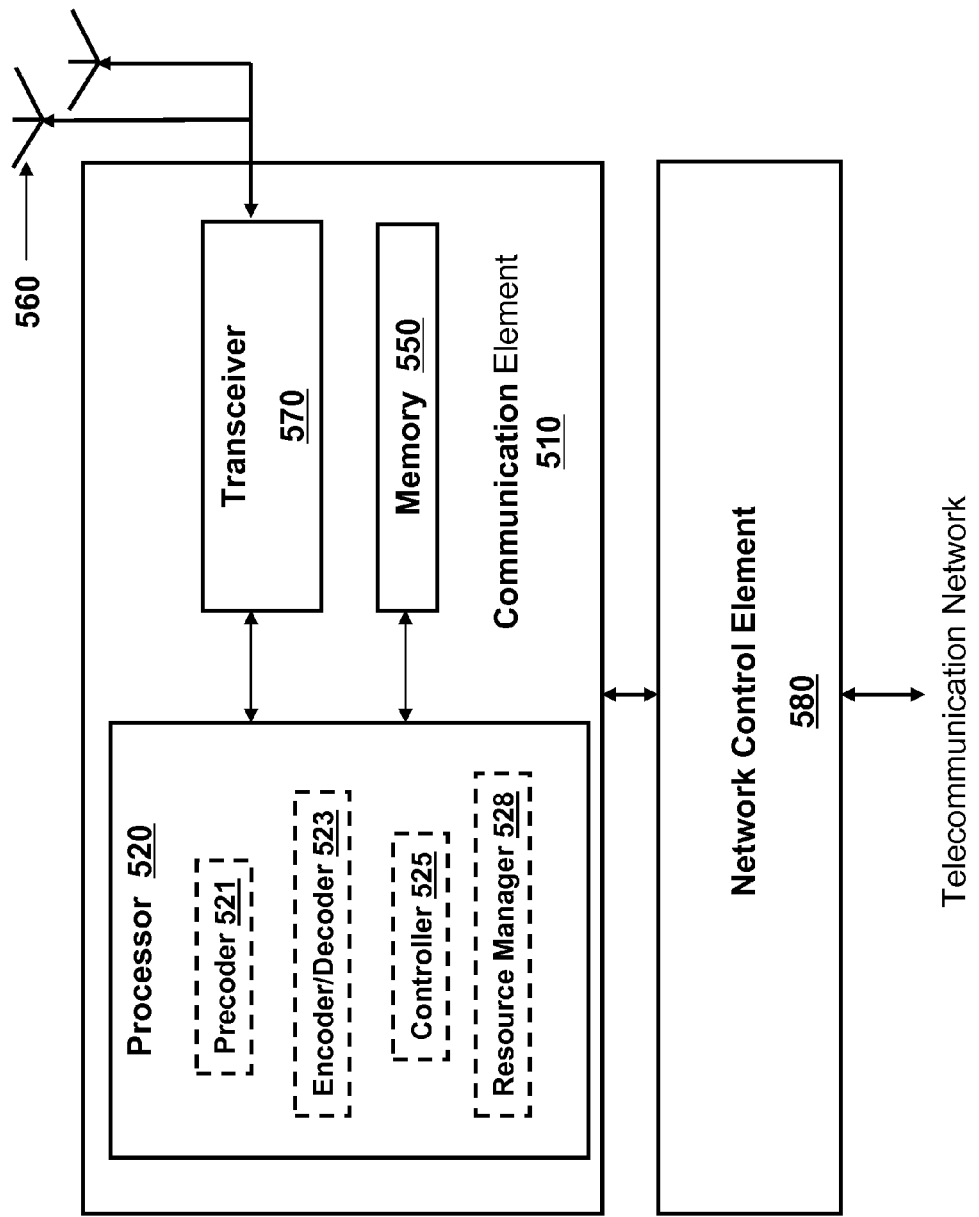
FIG. 5 illustrates a system level diagram of an embodiment of a communication element of a communication system for application of the principles of the present invention.

Turning now to FIG. 5, illustrated is a system level diagram of an embodiment of a communication element 510 of a communication system for application of the principles of the present invention. The communication element or device 510 may represent, without limitation, a base station, a wireless communication device (e.g., a subscriber station, terminal, mobile station, user equipment, machine), a network control element, a communication node, or the like. When the communication element or device 510 represents a communication node such as a user equipment, the user equipment may be configured to communicate with another communication node such as another user equipment employing one or more base stations as intermediaries in the communication path (referred to as cellular communications). The user equipment may also be configured to communicate directly with another user equipment without direct intervention of the base station in the communication path. The communication element 510 includes, at least, a processor 520, memory 550 that stores programs and data of a temporary or more permanent nature, a plurality of antennas 560, and a radio frequency transceiver 570 coupled to the antennas 560 and the processor 520 for bidirectional wireless communications. The communication element 510 may provide point-to-point and/or point-to-multipoint communication services.

The communication element 510, such as a base station in a cellular communication system or network, may be coupled to a communication network element, such as a network control element 580 of a public switched telecommunication network ("PSTN"). The network control element 580 may, in turn, be formed with a processor, memory, and other electronic elements (not shown). The network control element 580 generally provides access to a telecommunication network such as a PSTN. Access may be provided using fiber optic, coaxial, twisted pair, microwave communications, or similar link coupled to an appropriate link-terminating element. A communication element 510 formed as a wireless communication device is generally a self-contained device intended to be carried by an end user.

The processor 520 in the communication element 510, which may be implemented with one or a plurality of processing devices, performs functions associated with its operation including, without limitation, precoding of antenna gain/phase parameters (precoder 521), encoding and decoding (encoder/decoder 523) of individual bits forming a communication message in accordance with a detector, formatting of information, and overall control (controller 525) of the communication element, including processes related to management of communication resources (resource manager 528). Exemplary functions related to management of communication resources include, without limitation, hardware installation, traffic management, performance data analysis, tracking of end users and equipment, configuration management, end user administration, management of wireless communication devices, management of tariffs, subscriptions, security, billing and the like. For instance, in accordance with the memory 550, the resource manager 528 is configured to allocate primary and second communication resources (e.g., time and frequency communication resources) for transmission of voice communications and data to/from the communication element 510 and to format messages including the communication resources therefor in a primary and secondary communication system. Additionally, the resource manager 528 may manage interference between communication nodes in the primary and secondary communication system.

The execution of all or portions of particular functions or processes related to management of communication resources may be performed in equipment separate from and/or coupled to the communication element 510, with the results of such functions or processes communicated for execution to the communication element 510. The processor 520 of the communication element 510 may be of any type suitable to the local application environment, and may include one or more of general-purpose computers, special purpose computers, microprocessors, digital signal processors ("DSPs"), field-programmable gate arrays ("FPGAs"), application-specific integrated circuits ("ASICs"), and processors based on a multi-core processor architecture, as non-limiting examples.

The transceiver 570 of the communication element 510 modulates information on to a carrier waveform for transmission by the communication element 510 via the antennas 560 to another communication element. The transceiver 570 demodulates information received via the antennas 560 for further processing by other communication elements. The transceiver 570 is capable of supporting duplex operation for the communication element 510.

The memory 550 of the communication element 510, as introduced above, may be one or more memories and of any type suitable to the local application environment, and may be implemented using any suitable volatile or nonvolatile data storage technology such as a semiconductor-based memory device, a magnetic memory device and system, an optical memory device and system, fixed memory, and removable memory. The programs stored in the memory 550 may include program instructions or computer program code that, when executed by an associated processor, enable the communication element 510 to perform tasks as described herein. Of course, the memory 550 may form a data buffer for data transmitted to and from the communication element 510. Exemplary embodiments of the system, subsystems, and modules as described herein may be implemented, at least in part, by computer software executable by processors of, for instance, the wireless communication device and the base station, or by hardware, or by combinations thereof. As will become more apparent, systems, subsystems and modules may be embodied in the communication element 510 as illustrated and described herein.

To reduce the exponential process complexity of optimal Log-MAP detectors, some sub-optimal soft sphere and soft K-best Max-Log-MAP detection processes and their very large scale integration ("VLSI") architectures have been developed by various researchers. These sub-optimal Max-Log-MAP processes can be categorized as either depth-first soft sphere or breadth-first soft K-best tree-search procedures. The depth-first soft sphere procedure has non-deterministic complexity and variable throughput that make it sensitive to unpredictable channel conditions. Moreover, the depth-first soft sphere procedure with a small candidate list size suffers significant performance degradations due to inaccuracy and especially to infinite log-likelihood ratios ("LLRs"). On the other hand, the breadth-first soft K-best procedure has advantages of fixed complexity and fixed throughput that makes it friendly to a hardware implementation. However, when K (which represents number of candidates selected at each level of a tree-based search procedure) is large, the computational complexity of the K-best procedure increases dramatically because a large number of paths have to be extended and sorted. For example, as described by H. Kim, et al. in a reference entitled "Design Tradeoffs and Hardware Architecture for Real-Time Iterative MIMO Detection Using Sphere Decoding and LDPC Coding," IEEE J. Selected Areas in Communication, 26:1003-1014, August 2008, K=512 is suggested for a 4×4 constellation of size and 16 quadrature amplitude modulation ("QAM") MIMO communication system. Sorting is often the bottleneck in K-best detection, which limits the communication system throughput performance.

To reduce the exponential process complexity of the computationally intensive Log-MAP procedure, a sub-optimal Max-Log-MAP procedure is often used to approximate the optimal Log-MAP procedure. The main complexity of the Max-Log-MAP procedure is searching for candidates. A variety of Max-Log-MAP approximations have been investigated by researchers, such as the soft sphere detection procedure as described by B. Hochwald, et al., in a reference entitle Achieving Near-Capacity on a Multiple-Antenna Channel," IEEE Trans. Commun., 51:389-399, March 2003, by D. Garrett, et al. in a reference entitled "Silicon Complexity for Maximum Likelihood MIMO Detection Using Spherical Decoding," IEEE J. Solid-State Circuit, 39:1544-1552, September 2004, and by C. Studer, et al. in a reference entitled "Soft-Output Sphere Decoding: Algorithms and VLSI Implementation," IEEE Journal on Selected Areas in Communications, Vol. 26, pp. 290-300, February 2008. Further Max-Log-MAP approximations have been investigated by researchers based on a soft K-best detection procedure as described by Z. Guo, et al., in a reference entitled "Algorithm and Implementation of the K-Best Sphere Decoding for MIMO detection,"

IEEE J. Selected Areas in Communications, 24:491-503, March 2006. The aforementioned references are herein incorporated herein by reference. Although soft sphere or soft K-best procedures can effectively reduce the searching complexity of the Max-Log-MAP procedure, they still suffer from significant error performance degradation due to sub-optimal Max-Log-MAP approximation.

A soft-output multi-input, multi-output detector and detection procedure is introduced to overcome this limitation that uses a process referred to herein as the n-Term Log-Maximum A Posteriori Probability ("Log-MAP") detector or procedure. This procedure advantageously achieves near-optimum MIMO detection of a noisy digital signal with reduced computational complexity. A trellis-based search method is used to implement the n-Term Log-MAP procedure. The n-Term Log-MAP procedure is employable with a communication device in LTE and WiMAX communication systems as well as any other next generation standards (e.g., International Mobile Telecommunications Advanced ("IMT Advanced")). Thus, the apparatus, system and method to implement the reduced-complexity n-Term Log-MAP procedure can be applied to a communication device in a wide variety of communications systems in both uplink and downlink scenarios, and is especially suitable for low-power, high-throughput wireless communication applications such as cellular communication arrangements wherein an end user carries user equipment such as a small portable battery-powered device.

In the n-Term Log-MAP procedure, a reduced number "n" of exponential terms is used to approximate the original Log-MAP procedure. The n-Term Log-MAP procedure significantly outperforms the Max-Log-MAP procedure while retaining low implementation complexity. A trellis-based search method is used to find the exponential terms to implement the n-Term Log-MAP procedure. A trellis-based search method is described in U.S. patent application Ser. No. 12/475,755 entitled "Methods and Apparatuses for MIMO Detection," by Lilleberg, et al., filed Jun. 1, 2009, which is incorporated herein by reference. The trellis-based search method is extended as described herein for the n-Term Log-MAP procedure.

The search space of the MIMO signals is represented with a compact trellis diagram. The trellis has M stages corresponding to a number of transmit antennas, and each stage contains Q different nodes corresponding to the Q symbols of a complex constellation of the transmitted signal. In other words, the trellis is formed of columns representing the number of transmit antennas and rows representing values of a plurality of symbols with nodes at intersections thereof. Each trellis node is physically mapped to a transmit symbol that belongs to a known modulation alphabet of the Q constellation symbols. Thus, any path through the trellis represents a possible vector "s" of transmitted symbols. In the trellis-based search method, the searching operation is evenly spread among the trellis nodes, wherein each node keeps a list of L (e.g., $1<=L<=Q$) most likely paths from all its incoming paths. The number L of most likely paths may refer to the paths with the shortest distance (or minimum Euclidean distance) or lowest path weight. Preferably, the number L of most likely paths is less than or equal to the constellation size Q. A constellation size Q refers to Q symbols within the constellation, which results in Q nodes in the trellis at each stage. Altogether Q×L candidates in each stage k of the M stages of the trellis can be used to compute the log-likelihood ratios ("LLRs") for data bits transmitted by an antenna k using the n-Term Log-MAP procedure, wherein n=(Q×L)/2. As described herein, the number L refers to the number of incoming paths to a node in accordance with a path reduction procedure and number of outgoing paths from a node in accordance with a path extension procedure. In general, the number L refers to the number of surviving paths to or from a trellis node.

The number L can be larger than the constellation size Q. The maximum theoretical value of the number L is $Q^k$, wherein k=1, 2 ... N for the first stage, second stage, etc., of the trellis. Practically, however, the number L should not be bigger than the constellation size Q. The n-Term Log-MAP procedure is an approximation procedure. The smaller number L helps to reduce its complexity. If a maximum possible value is used for the number L, then the n-Term Log-MAP procedure becomes an exhaustive search. Given a modulation alphabet of constellation size Q, the number L determines the decoding performance: A larger size for the number L leads to better error performance. For example, even with a small value for the number L (such as L=4 for Q=16), the n-Term Log-MAP procedure can achieve near-optimum decoding performance.

The reduced-complexity n-Term Log-MAP procedure introduced herein employs n=(Q×L)/2 exponential terms to approximate the original Log-MAP procedure, wherein n is much less than $Q^M$. For example, the case Q=4, L=2, and M=4 results in n=4 and $Q^M$=256, illustrating a substantial reduction by a factor of 32 in computational complexity compared to conventional systems. A trellis-based search method is used to find the 2n mostly likely received candidate symbols for each antenna. The search operation is evenly spread among the nodes in each trellis stage, which not only limits the number of candidate symbols, but also reduces the overall sorting cost. By spreading the operation among the nodes, the amount of computation to perform the search is distributed throughout the trellis. The computational complexity of the procedure grows only linearly with the number of antennas. The n-Term Log-MAP procedure has significant error performance advantage over the traditional soft K-best and soft sphere Max-Log-MAP procedures. Further, the procedure as introduced herein has a very low sorting cost and is suitable for a parallel digital implementation.

In order to address the challenge of reducing the computational intensity of a brute-force implementation of the Log-MAP procedure, the n-Term Log-MAP procedure uses the number n most likely candidate symbols (or bit values thereof) to approximate the original Log-MAP procedure. A trellis-based search method is modified as introduced herein to implement the n-Term Log-MAP procedure. In the trellis-based search method, a distributed search process with scalable list size L is applied to prune unlikely candidates and thereby significantly reduce overall detection cost.

The n-Term Log-MAP procedure introduced herein can be summarized as follows: A log-sum of n exponential terms is implemented with substantially reduced computational complexity to approximate the optimum Log-MAP procedure, which ordinarily requires calculating the log-sum of $Q^M/2$ exponential terms. A trellis-based search method is used to find the most likely candidates to implement the n-Term Log-MAP procedure.

The optimal MAP detection procedure computes the log-likelihood ratio ("LLR") value as illustrated below by equation (1) for the a posteriori probability ("APP") of each coded bit $x_{k,b}$, wherein the indices k and b are the antenna index and the binary-bit index, respectively:

$$LLR(x_{k,b}) = \log \frac{Pr[x_{k,b} = 0 \mid y]}{Pr[x_{k,b} = 1 \mid y]} = \log \frac{\sum_{s:x_{k,b}=0} \exp\left(-\frac{1}{2\sigma^2}\|y - Hs\|^2\right)}{\sum_{s:x_{k,b}=1} \exp\left(-\frac{1}{2\sigma^2}\|y - Hs\|^2\right)} \quad (1)$$

In equation (1) above, the LLR of each coded bit $x_{k,b}$ is calculated as the logarithm of the ratio of the probability that the coded bit $x_{k,b}$ is equal to 0 given a received signal y, to the probability that the coded bit $x_{k,b}$ is equal to 1 given the received signal y. The double vertical lines surrounding a vector represent a Euclidean magnitude of the vector. The parameter $\sigma^2$ represents the variance of channel noise at the receiver (or transceiver) of the communication device. A transmitted signal may include data that describes its signal-to-noise ratio. The channel matrix H is the complex M×N channel matrix, wherein each element $h_{i,j}$ is an independent zero mean circularly symmetric complex Gaussian random variable with unit variance. The symbol vector s represents the complex transmitted constellation signal from the M transmit antennas associated with the coded bits $x_{k,b}$. This computation illustrated by equation (1) produces the result that the coded bit $x_{k,b}$ is 0 if the log of the LLR ratio is positive and, conversely, the coded bit $x_{k,b}$ is 1 if the log of the LLR ratio is negative. Alternatively, if the logarithm of the probability ratio is not taken, the coded bit $x_{k,b}$ is 0 if the probability ratio is greater than one and, conversely, the coded bit $x_{k,b}$ is 1 if the probability ratio is less than one.

The LLR computation in equation (1) includes calculating two log-sums of $Q^M/2$ exponential terms, wherein Q is the constellation size and M is the number of transmit antennas. The brute-force implementation of equation (1) is too complex to be implemented in a practical communication device such as a portable battery-powered communication device. As introduced herein, a reduced number "n" of exponential terms is used to approximate the optimal Log-MAP procedure as set forth below by equation (2).

$$LLR(x_{k,b}) \approx \log \sum_{i=0:x_{k,b}=0}^{n-1} \exp\left(-\frac{1}{2\sigma^2}\|y - Hs\|^2\right) - \log \sum_{i=0:x_{k,b}=1}^{n-1} \exp\left(-\frac{1}{2\sigma^2}\|y - Hs\|^2\right), \quad (2)$$

wherein n is a predefined number that is preferably less than $Q^M/2$. The detection problem now becomes an n-Term minimum Euclidean distance finding problem conditioned on the bits $x_{k,b}=0$ and $x_{k,b}=1$. The n terms in the equation above are selected for the computation as described herein.

A low-complexity trellis-based search method is employed to find n minimum Euclidean distances. A conventional unitary-upper triangular matrix decomposition ("QR decomposition") is first performed on the complex channel matrix H by representing the channel matrix H as the product of two matrices Q×R, where the matrix Q is a unitary matrix whose columns are orthogonal unit vectors, and the matrix R is an upper triangular matrix. It should be understood that the Q referred to in the QR decomposition is different than the Q with respect to the constellation size. Since the performance of the communication channel is generally slowly varying, the QR decomposition of the channel matrix H need only be performed infrequently. Then the Euclidean distance or path weight d(s) is calculated as set forth below by equation (3).

$$d(s) = \|y - Hs\|^2 = \|y' - Rs\|^2 = \sum_{k=0}^{M-1} |(y')_k - (Rs)_k|^2, \quad (3)$$

wherein $y'=Q^H y$, $(.)_k$ denotes the k-th element of a vector, and the exponent H in the equation for y' in terms of the vector y denotes the Hermetian operator of conjugation and transposition (which should not be confused with the channel matrix H).

Calculating the Euclidean distance d(s) with the upper triangular matrix R enables the trellis-based search method to be started at one side of the trellis (i.e., at one antenna), which is effectively decoupled thereby from the responses of the other antennas. In an advantageous embodiment, the antenna with the strongest signal response is selectively placed at the side of the trellis at which the trellis search method is started.

The Euclidean distance d(s) is advantageously computed backwardly recursively as $d_k = d_{k+1} + e_k$ wherein the metric increment $e_k$ is defined by equation (4) as set forth below.

$$e_k = \left| y'_k - \sum_{j=k}^{M-1} R_{k,j} s_j \right|^2 \quad (4)$$

Figure 6:
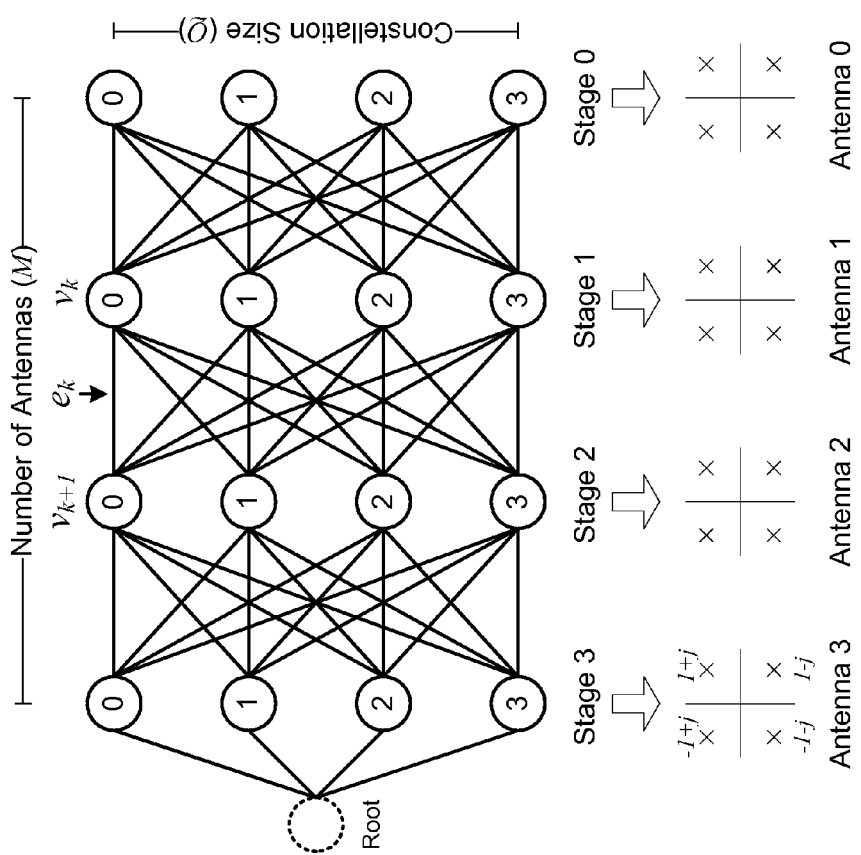
FIG. 6 illustrates a diagram of an embodiment of a trellis constructed according to the principles of the present invention.

Turning now to FIG. 6, illustrated is a diagram of an embodiment of a trellis constructed according to the principles of the present invention. The exemplary trellis represents a 4×4 (four transmit antennas employing a constellation size including four symbols) quadrature phase-shift keyed ("QPSK") system to visualize the calculation of the Euclidean distance d(s). In the trellis, the four nodes are ordered into M=4 stages labeled stage 0, stage 1, stage 2, and stage 3. The assignment of antennas to particular stages can be arbitrary, but in an advantageous embodiment, the antenna with best signal-to-noise characteristic is assigned to the leftmost stage. The trellis starts with stage 3=M−1 and ends with stage 0, where each stage k, 0≤k≤M−1, corresponds to a transmit antenna k. In each stage/level, there are Q=4 different nodes representing the four possible transmitted symbols in the constellation. Altogether, there are $4^4$=256 paths through this 4×4 trellis. Below the trellis are illustrated the points of the QPSK constellations, with x's illustrating the locations of these points in the complex plane. Each trellis node represents in essence a hypothesis for the QPSK symbol transmitted by the particular antenna. Thus, each node maps to a constellation point (i.e., a complex QPSK symbol, or more generally, a complex QAM symbol) that belongs to a known alphabet of Q symbols. Each transmitted vector is a particular path through the trellis diagram.

In the trellis representation, the total number of the nodes grows linearly with the number of transmit antennas when using the tree structure, instead of growing exponentially. The trellis is fully connected which results in $Q^M$ different paths through the trellis (i.e., any path through the trellis is a possible path). The nodes in stage k are denoted as $v_k(q)$ (0≤q≤Q−1). The edge between nodes $v_{k+1}(q')$ and $v_k(q)$ has a edge weight of $e_k(q^{(k)})$, wherein $q^{(k)}$ is the partial symbol vector. A weight is assigned to each edge between nodes in successive stages in the trellis so that the problem of MIMO detection is transformed into a minimum-weight trellis search problem. Each path through the trellis corresponds to a transmitted symbol vector s. In the trellis diagram, a path weight d is the sum of the edge weights e between nodes along the particular path. To find the number $n=(Q \times L)/2$ shortest paths for each hypothesis of the coded bit $x_{k,b}$ (i.e., to find the number n shortest paths for the bit $x_{k,b}=1$ and $x_{k,b}=0$), a trellis search method is employed that is summarized below. In order to reduce the search space, a path reduction process is employed to prune unlikely paths in the trellis.

Figure 7:
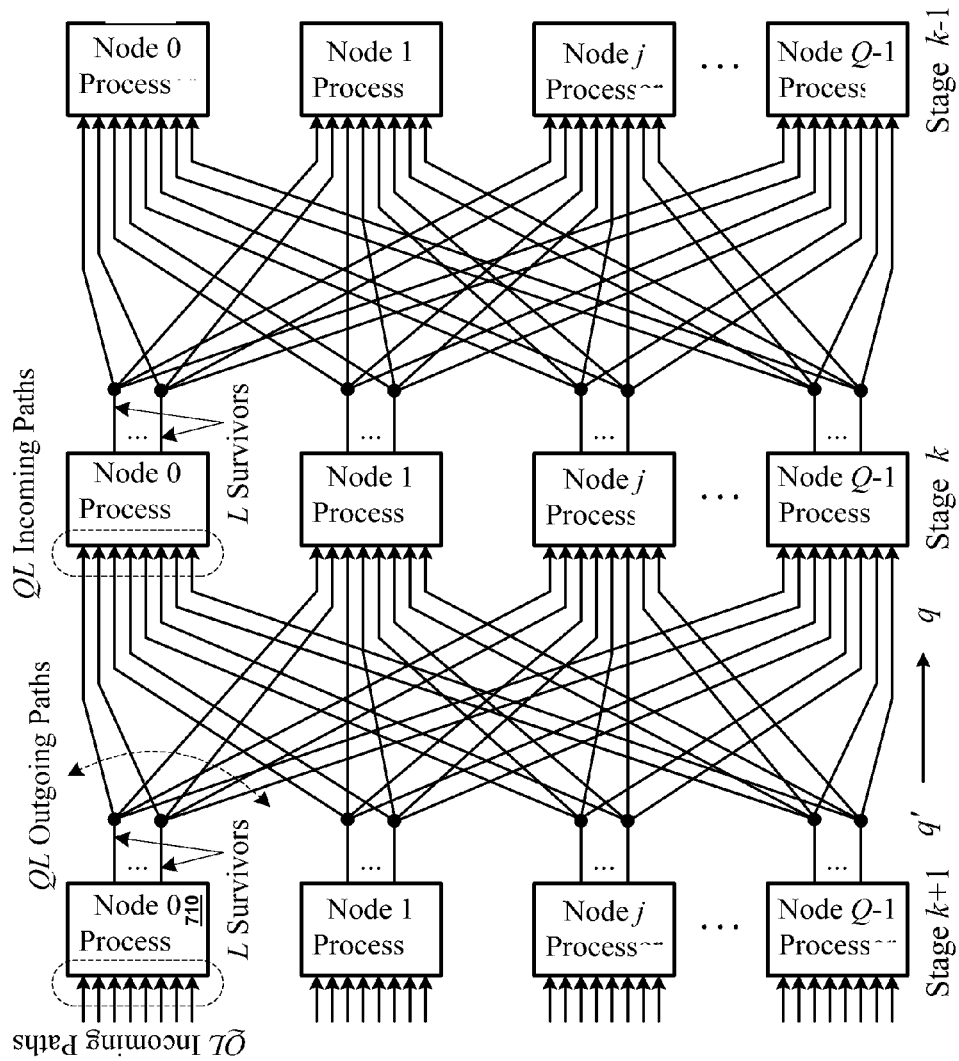
FIG. 7 illustrates a flow diagram demonstrating an embodiment of a path reduction procedure constructed according to the principles of the present invention.

Turning now to FIG. 7, illustrated is a flow diagram demonstrating an embodiment of a path reduction procedure constructed according to the principles of the present invention. The path reduction procedure is configured to prune paths for each trellis node to a smaller number of surviving paths. In FIG. 7, each trellis node, such as trellis node 710, is advantageously illustrated with a dedicated node process that may operate on a dedicated processor or subprocess on a single processor for many nodes. Of course, a smaller number of processes can operate collectively on the trellis nodes. The stages (columns) of the trellis are labeled in descending order, starting from stage M−1 at the left and ending with stage 0. Note that FIG. 7 illustrates only three successive stages, k+1, k, and k−1 among the M stages. Each node process receives $Q \times L = 4 \times 2 = 8$ incoming path candidates from nodes in the previous stage of the trellis and, then, the L=2 paths (the ones with the least number of cumulative path weights) are selected from these Q×L candidates. Next, the number L survivors are fully extended to the right so that each node will have the best Q×L outgoing paths forwarded to the next stage of the trellis. This process repeats until the end of the trellis.

Figure 8:
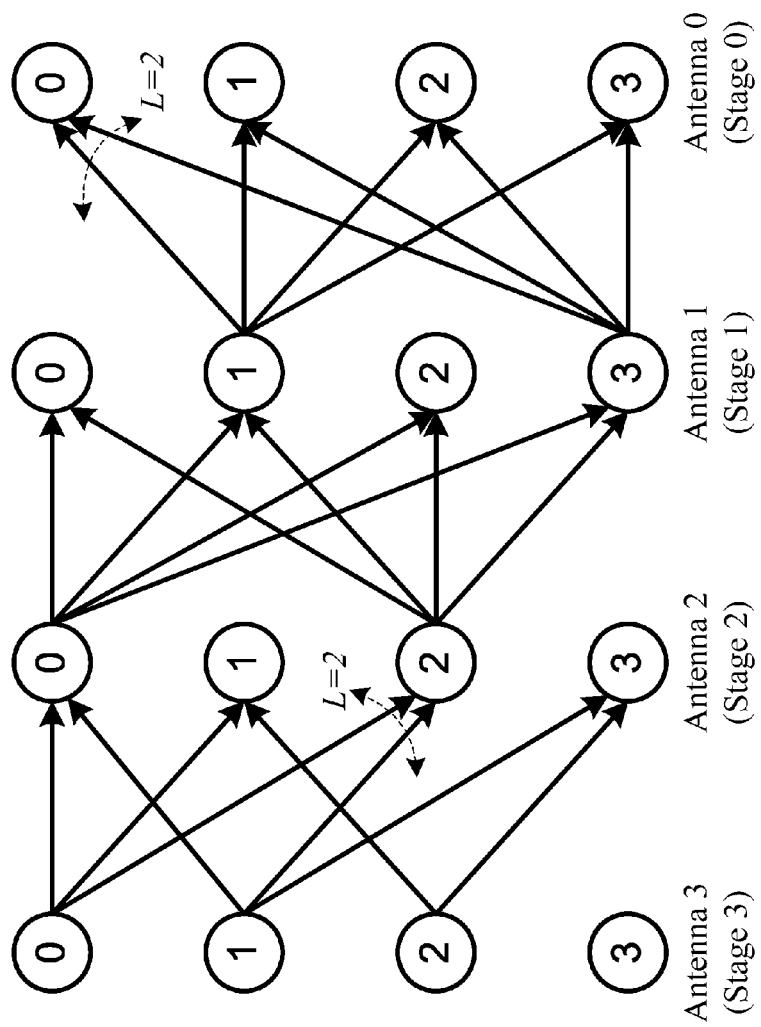
FIG. 8 illustrates a diagram of an embodiment of a trellis following a path reduction procedure constructed according to the principles of the present invention.

Turning now to FIG. 8, illustrated is a diagram of an embodiment of a trellis following a path reduction procedure constructed according to the principles of the present invention. The illustrated embodiment demonstrates a 4×4 QPSK trellis after applying the path reduction procedure, wherein each node keeps only L=2 best incoming paths, the ones with the least cumulative path weights. In FIG. 8, the stages of the trellis are shown in the columns and the nodes are shown as numbered circles corresponding to constellation symbols. Note that symbol 3 at antenna stage 3 shows no outgoing paths because these paths were dropped as incoming paths by respective trellis symbol nodes at a prior antenna stage.

The path reduction procedure can effectively prune the trellis by keeping only the number L of best incoming paths at each trellis node. As a result, each trellis node in the last stage of the trellis has the number L shortest paths through the trellis. However, other than the trellis nodes in the last stage, the procedure cannot guarantee that every trellis node will have the number L shortest paths through the trellis. For example, nodes 1 and 3 at stage 2 of the trellis as illustrated in FIG. 8 have only uncompleted paths. These paths may be added as path extensions as described later hereinbelow.

An objective of the trellis search method is to find the number L of shortest paths for every node in the trellis. To achieve this goal, a path extension procedure is employed after the path reduction procedure to extend those uncompleted paths. The path extension procedure is used to fill in the missing paths for each trellis node q at stage k (k>0). The goal is to extend the uncompleted paths so that each node will have the number L of shortest paths through the trellis. The path extension is performed stage by stage, and node by node.

Figure 9:
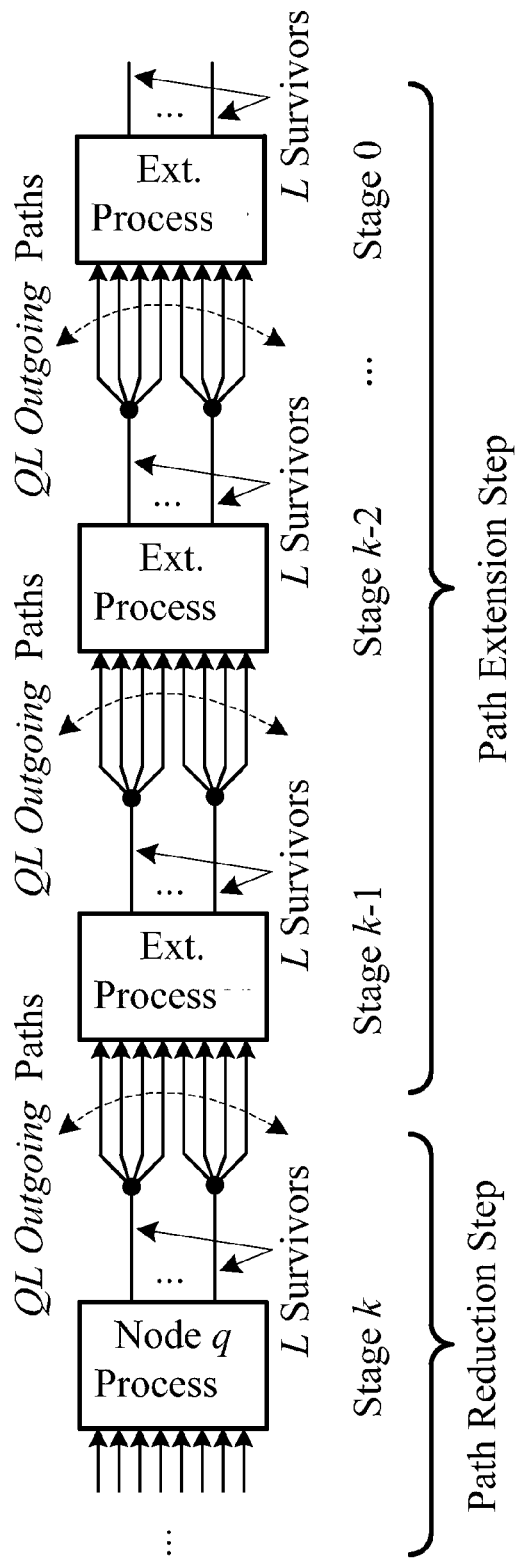
FIG. 9 illustrates a flow diagram demonstrating an embodiment of a path extension procedure constructed according to the principles of the present invention.

Turning now to FIG. 9, illustrated is a flow diagram demonstrating an embodiment of a path extension procedure constructed according to the principles of the present invention. The path extension procedure is being demonstrated with respect to a node q in a stage k, and all of the nodes in the same stage can be processed in parallel and independently, may operate on a dedicated processor or subprocess on a single processor for many nodes. As shown in FIG. 9, for a trellis node with a constellation symbol $v_k(q)$ (i.e., for the constellation symbol q in stage k), the path extension procedure first retrieves the Q×L outgoing path metrics computed in the path reduction step (at stage k), and then an extension process (Ext. Process) in stage k−1 selects the best L outgoing paths (e.g., with minimal Euclidean distance to the next node) from these Q×L candidates. Next, each of these number L surviving paths is fully extended for the next stage of the trellis (stage k−2). Among these Q×L extended paths, only the best number L paths are retained (e.g., the ones with the lowest accumulated Euclidean distance d(s)). This process repeats until the trellis has been completely traversed.

FIG. 9 shows a path extension procedure for one trellis node at several stages in the trellis. In fact, all the nodes in stage k are extended as necessary so that each node can find the number L shortest paths through the trellis. Generally as shown in FIG. 9, to detect a symbol associated with antenna k, the entire search process can be expressed as M−k stages of path reductions followed by k stages of path extensions. In other words, the path reduction procedure is first performed until stage k of the trellis and next the path extension procedure is performed until the end of the trellis (stage 0).

Turning now to FIGS. 10A and 10B, illustrated are diagrams of an embodiment of a trellis following a path reduction procedure constructed according to the principles of the present invention. FIG. 10A illustrates the trellis following two stages of path reduction. The path reduction procedure is directed to a node $v_2(1)$ (i.e., for the node labeled 1 in stage 2), wherein the number L=2 shortest paths are found for this node). Again, the stages of the trellis are labeled stage 0, . . . , stage 3, and the nodes are shown as numbered circles corresponding to constellation symbols. Each node has a number L incoming paths, and the objective is to provide the number L full paths through each node because the previous stage was pruned to the number L paths.

After the path extension procedure, every node $v_k(q)$ has successfully found the number L shortest paths or the number L minimum Euclidean distances denoted as $d_k^{(l)}(q)$, l=0, 1, . . . , L−1; q=0, 1, . . . , Q−1. The LLR for data bit $x_{k,b}$ transmitted by antenna k is then approximated using the following n-Term Log-MAP procedure of equation (5).

$$LLR(x_{k,b}) \approx \log \sum_{(q,l):x_{k,b}=0} \exp\left(-\frac{1}{2\sigma^2} d_k^{(l)}(q)\right) - \log \sum_{(q,l):x_{k,b}=1} \exp\left(-\frac{1}{2\sigma^2} d_k^{(l)}(q)\right) \quad (5)$$

In equation (5) above, two log-sums of the number $n=Q \times L/2$ exponential terms are computed. The two-term log-sum can be advantageously computed using the Jacobean procedure as follows:

$$\log \Sigma(\exp(a) + \exp(b)) = \max(a,b) + \log(1 + \exp(|a-b|))$$
$$= \max^*(a,b),$$

wherein $\log(1+\exp(|a-b|))$ can be quickly approximated by using a one-dimensional look-up table accessed by the parameter $|a-b|$. Moreover, the n-term log-sum for n=4, 8, 16, etc., can be recursively computed using the Jacobean procedure. The follow equation shows a recursive example to implement a four-term log-sum.

$$\max^*(a,b,c,d) = \max^*(\max^*(a,b), \max^*(c,d))$$

An eight-term sum can be similarly recursively implemented using a four-term sum, etc. Recall that the number of summed terms grows exponentially as powers of two for the size of the constellation alphabet.

To reduce further the complexity of LLR generation in equation (5), the computation is separated into two steps. Each stage (column) of the trellis corresponds to a transmit antenna, and each node in a stage is mapped to a particular constellation point. A symbol reliability metric $\Gamma(q)$ is first computed for each node q as follows.

$$\Gamma_k(q) = \log \sum_{l=0}^{L-1} \exp\left(-\frac{1}{2\sigma^2} d_k^{(l)}(q)\right) = \max_l{}^*\left(-\frac{1}{2\sigma^2} d_k^{(l)}(q)\right) \quad (6)$$

Then equation (5) is changed to obtain the simplification provided by the Jacobean procedure:

$$LLR(x_{k,b}) \approx \log \sum_{q:x_{k,b}=0} \exp(\Gamma_k(q)) - \log \sum_{q:x_{k,b}=1} \exp(\Gamma_k(q)) =$$

$$\max_{q:x_{k,b}=0}{}^* (\Gamma_k(q)) - \max_{q:x_{k,b}=1}{}^* (\Gamma_k(q))$$

An error performance of the n-Term Log-MAP procedure illustrates exemplary advantages associated therewith.

Figure 11:
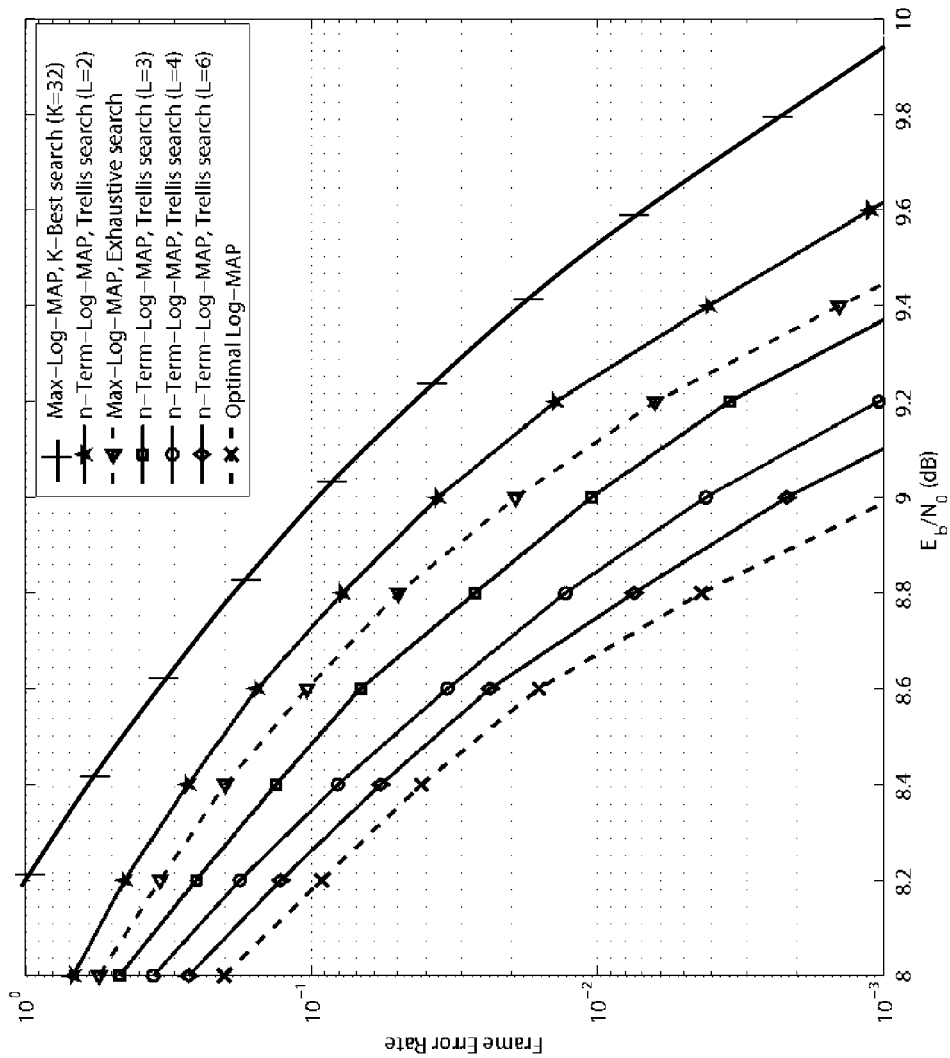
FIG. 11 illustrates a graphical representation demonstrating an exemplary performance and the accompanying advantages of a trellis-based detection procedure according to the principles of the present invention.

In accordance therewith, FIG. 11 illustrates a graphical representation demonstrating an exemplary performance and the accompanying advantages of a trellis-based detection procedure (i.e., a n-Term Log-MAP procedure) according to the principles of the present invention. Floating-point simulations are performed for a 4×4, 16-QAM (constellation size 16) system, wherein the channel matrices are assumed to have independent random Gaussian distributions and the number n=(Q×L)/2 (Q is the constellation size and L is the number of surviving paths at each node). The simulation results are illustrated in FIG. 11 with the performance of several MIMO detection procedures including the n-Term Log-MAP procedure for several values of the number L that limits the number of surviving outgoing paths. A (2304, 1152) (2304 output bits, 1152 input bits) WiMax low-density parity-check ("LDPC") code is used as an outer channel code. For comparison, simulation results are also plotted for the optimal Log-MAP procedure (which exhibits the quality frame error-rate performance, but is not practical), for the Max-Log-MAP procedure based on an exhaustive search, and for the Max-Log-MAP K-best search procedure with K=32. As can be seen in FIG. 11, the n-Term Log-MAP procedure with the number L=2 significantly outperforms the K-best procedure with K=32. The n-Term Log-MAP procedure with the number L=3 outperforms the Max-Log-MAP procedure with the exhaustive search criterion. The n-Term Log-MAP procedure with the number L=4 and 6 performs very close to the optimal Log-MAP procedure. It can be seen that with a relatively small number L, such as L=6, the n-Term Log-MAP procedure can achieve near-optimal detection performance.

Since sorting is often the bottleneck for the K-best procedure, the sorting complexity of the n-Term Log-MAP procedure can be compared with that of the K-best procedure. The sorting complexity is measured by the number of pair-wise comparisons. For the n-Term Log-MAP procedure, constellation size Q concurrent (Q×L, L) sorting is performed at each trellis stage, where the notation (A, B) for sorting complexity denotes partial sorting where B minimum values are selected from A candidates. TABLE 1 below summarizes the sorting complexity of the n-Term Log-MAP procedure and the K-best procedure. As can be seen, the n-Term Log-MAP procedure not only has significantly lower sorting complexity than the tree-based K-best procedure, but also has much better error performance than the K-best procedure.

TABLE 1

Sorting Complexity Comparison for 4×4 16-QAM System

|  | n-Term Log-MAP | K-Best |
|---|---|---|
| Sorting complexity per tree/trellis level/stage | (32, 2) = 35 16 parallel sortings | (512, 32) ≈ 2323 1 global sorting |
| Speedup | 66 times better | — |
| Required signal-to-noise ratio for $10^{-3}$ FER (frame error rate) | 9.6 dB | 9.95 dB |

Figure 12:
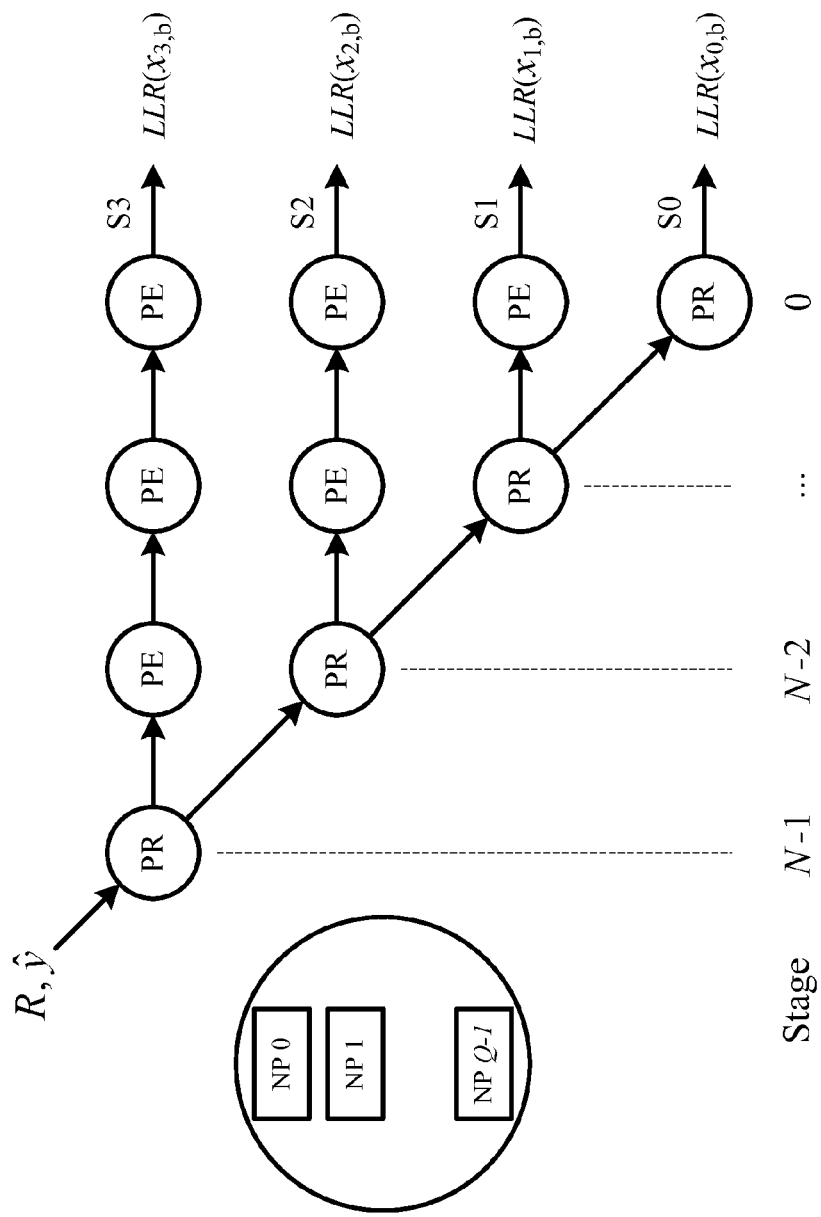
FIG. 12, illustrated is a diagram of an embodiment of a pipelined systolic array architecture for a trellis-based detection procedure according to the principles of the present invention.

Turning now to FIG. 12, illustrated is a diagram of an embodiment of a pipelined systolic array architecture for a trellis-based detection procedure (i.e., a n-Term Log-MAP procedure) according to the principles of the present invention. In the illustrated embodiment, the number M of transmit antennas is four. The elements on the main diagonal are path reduction ("PR") units, wherein each path reduction unit performs one stage of the path reduction operation. The elements not on the main diagonal are the path extension ("PE") units, wherein each path extension unit does one stage of the path extension operation. Each path reduction or path extension unit employs parallel node processes that implement the path reduction or path extension procedures. The detection procedure is fully pipelined so that it can process one MIMO symbol at each clock cycle, resulting in a very high data throughput. With this architecture, multiple gigabits per second ("Gbps") detection speed is feasible in a communication device such as a user equipment powered by a small battery.

Assuming a system clock of 400 megahertz, TABLE 2 below summarizes the throughput performance for different MIMO system configurations. It should be noted that TABLE 2 shows the maximum throughput this detection procedure can support. The n-Term Log-MAP architecture is scalable and can be tailored for different data-rate applications.

TABLE 2

Throughput Performance of a n-Term Log-MAP Detector for Different MIMO Configurations

|  | 4×4 MIMO | 6×6 MIMO | 8×8 MIMO |
|---|---|---|---|
| 4-QAM | 3.2 Gbps | 4.8 Gbps | 6.4 Gbps |
| 16-QAM | 6.4 Gbps | 9.6 Gbps | 12.8 Gbps |
| 64-QAM | 9.6 Gbps | 14.4 Gbps | 19.2 Gbps |

Figure 13:
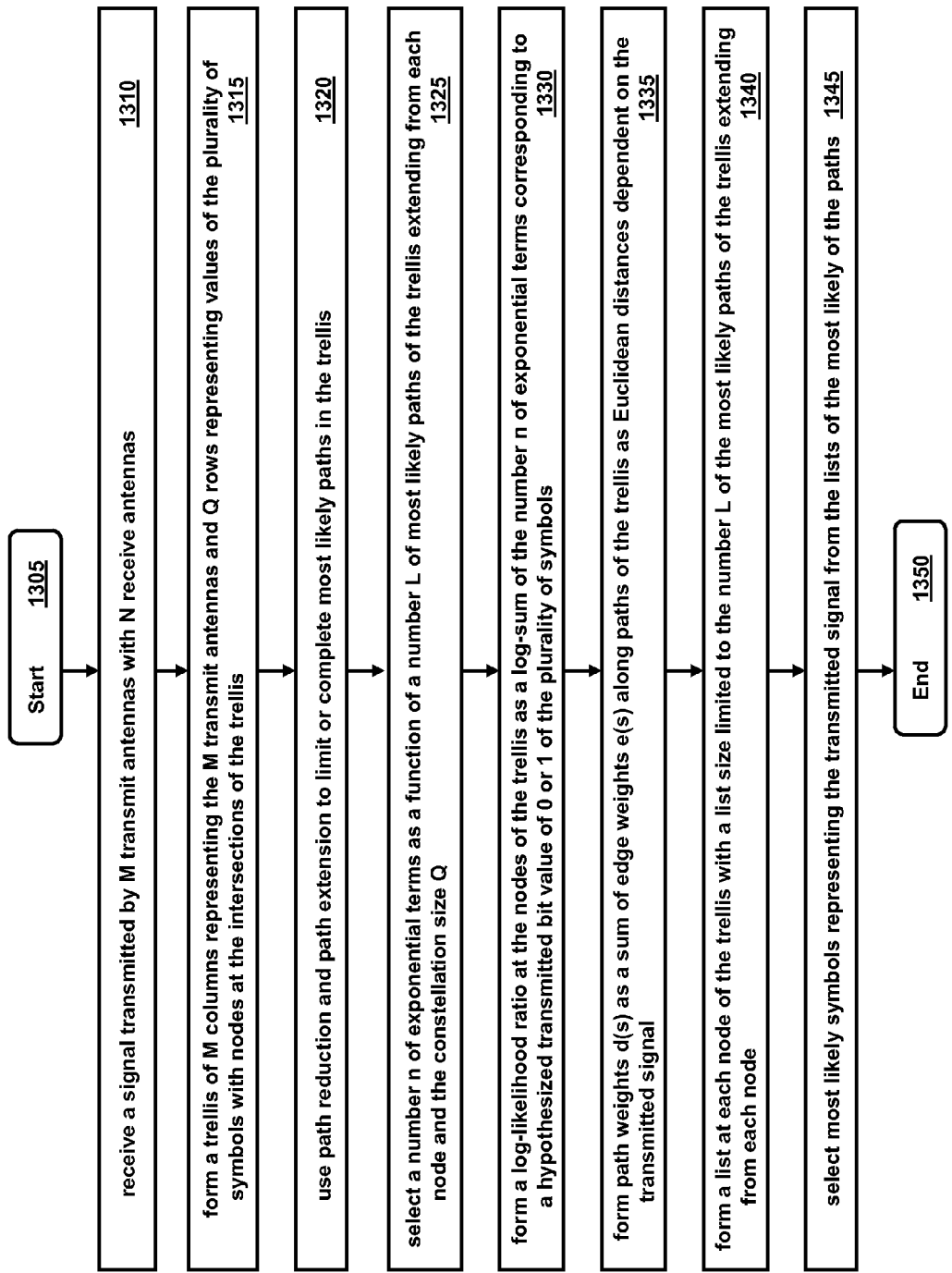
FIG. 13 illustrates a flowchart of an embodiment of a trellis-based detection procedure according to the principles of the present invention.

Turning now to FIG. 13, illustrated is a flowchart of an embodiment of a trellis-based detection procedure according to the principles of the present invention. A transmitted signal s formed from a plurality of symbols is presumed to be transmitted by M transmit antennas by a remote transmitting station. Each symbol in the transmitted signal s has a constellation size Q that is preferably the same for all the symbols.

The detection procedure begins in a step or module 1305. In a step or module 1310, the transmitted signal s is received by a communication device with N receive antennas over a communication channel that is described by an M-by-N channel matrix H. In a step or module 1315, a trellis is formed of M columns representing the M transmit antennas and Q rows representing values of the plurality of symbols, with nodes at the intersections of the columns and rows of the trellis. In a step or module 1320, a path reduction procedure is used to limit the number of most likely paths of the trellis and a path extension procedure is used to extend uncompleted paths of the trellis. In a step or module 1325, a number n of exponential terms is selected, the number n being a function of a number L of most likely paths of the trellis extending from each node and of the constellation size Q. The number L of the most likely paths is preferably less than or equal to the constellation size Q. The number n of exponential terms is preferably equal to $(Q \times L)/2$. In a step or module 1330, a log-likelihood ratio is formed at the nodes of the trellis as a log-sum of a number n of exponential terms corresponding to a hypothesized transmitted bit value of 0 or 1 of the plurality of symbols. The log-sum of the number n of exponential terms, which approximates a Log-Maximum A Posteriori Probability ("Log-MAP") procedure, is preferably computed recursively using a Jacobean procedure. The number n of exponential terms is limited by a function of a number L of most likely paths of the trellis extending from each the node and the constellation size Q. In a step or module 1335, path weights d(s) are formed as a sum of edge weights e(s) along paths of the trellis as Euclidean distances dependent on the transmitted signal. The path weights d(s) are formed employing a unitary-upper triangular decomposition (QR decomposition) of the channel matrix H. In a step or module 1340, a list is formed at each node of the trellis with the list size limited to the number L of the most likely paths of the trellis extending from each node. In a step or module 1345, mostly likely symbols representing the transmitted signal are selected from the lists of the most likely of the paths. The process ends in a step or module 1350.

Thus, an n-Term Log-MAP procedure can be advantageously constructed with beneficial error performance compared to prior-art approximations of an optimal log-MAP detection procedure. The detection procedure as described herein employs a path-pruning operation in a MIMO trellis wherein a predefined number of candidates are retained at each trellis node, a path extension operation wherein the trellis is extended to fill in the missing paths, and multiple exponential terms are used to compute the log-sum for LLR generation.

The advantageous error performance of the n-Term Log-MAP procedure can be achieved with a small list size number L of most likely paths through the trellis. Compared to the optimal log-MAP detection procedure, the n-Term Log-MAP procedure with $L \geq 4$ shows only very small performance degradation (<0.2 dB). Compared to the max-log-MAP procedure with an exhaustive search criterion, the n-Term Log-MAP procedure with $L \geq 3$ shows better error performance. Compared to the K-best procedure with K=32, the n-Term Log-MAP procedure shows a significant performance gain with $L \geq 2$ (>0.4 dB). Almost all the current solutions such as sphere detection and K-best detection are based on a max-log-MAP approximation, which limits the error performance. Thus, the n-Term Log-MAP procedure exhibits a significant performance advantage over the current solutions.

For instance, the n-Term log-MAP procedure has low complexity and low latency. A very low sorting operation is required, which leads to high-speed detection. The sorting cost of this solution is an order of magnitude lower than that of the conventional K-best procedure. The n-Term Log-MAP procedure provides accurate LLR generation. Multiple exponential terms are used in the log-sum computation to improve the LLR generation.

The n-Term Log-MAP procedure enables a high-speed very large scale integration ("VLSI") implementation. This characteristic is very suitable for high-speed VLSI implementation. All the vertical trellis nodes can be processed in parallel. The trellis node processes in different trellis stages can be fully pipelined meaning that different processes within a processor or multiple processors can perform the intended task at each stage. The pipelined systolic array architecture as described herein can support multiple Gbps detection speeds. The throughput performance is an order of magnitude higher than the conventional K-best or sphere detection procedures.

The n-Term Log-MAP procedure is scalable for antenna number and modulation complexity. The systolic array architecture (which is composed of matrix-like rows of data processing units called cells) can be scaled for these parameters. The n-Term Log-MAP procedure can be applied to a base station, user equipment or any communication device of a communication system. For instance, in the context of an uplink communication channel, the detection procedure as described herein may be embodied in a processor of base station in uplink multi-user detection scenarios wherein multiple user equipment with a small number of antennas try to use the same channel for sending data to the base station. In a downlink channel with MIMO reception capability at a user equipment with multiple antennas, which have been discussed for 3GPP LTE and the IMT-Advanced standard, the detection procedure as described herein can be embodied in a processor of the user equipment for receiving data in a transmitted signal from a base station.

Thus, an apparatus, method and system for trellis-based detection in a communication system have been introduced herein. In one embodiment, an apparatus includes a processor and memory including computer program code. The memory and the computer program code are configured to, with the processor, cause the apparatus to construct a trellis representing a transmitted signal formed from a plurality of symbols transmitted by a number M of transmit antennas, wherein each symbol has a constellation size Q. The trellis is formed of columns representing the number M of transmit antennas and rows representing values of the plurality of symbols with nodes at intersections thereof. The memory and the computer program code are further configured to, with the processor, cause the apparatus to form a log likelihood ratio at the nodes of the trellis as a log-sum of a number n of exponential terms corresponding to a hypothesized transmitted bit value of 0 or 1 of the plurality of symbols. The number n of exponential terms are limited by a function of a number L of most likely paths of the trellis extending from each node of the trellis and the constellation size Q. The memory and the computer program code are further configured to, with the processor, cause the apparatus to form a list at each node of the trellis of a size limited to the number L of the most likely paths of the trellis extending from each node of the trellis and select a mostly likely symbol representing at least a portion of the transmitted signal from the lists of the most likely paths of the trellis.

In a related embodiment, the memory and the computer program code are further configured to, with the processor, cause the apparatus to form path weights d(s) as a sum of edge weights e(s) along paths of the trellis as Euclidean distances dependent on the transmitted signal. In accordance therewith, the transmitted signal is received by a number N of receive antennas over a communication channel as described by a M×N channel matrix H, wherein the path weights d(s) are formed employing a unitary-upper triangular (QR) decomposition of the channel matrix H. Additionally, the number n of exponential terms is equal to constellation size Q times the number L of the most likely paths of the trellis divided by two. The number L of the most likely paths of the trellis may also be less than or equal to the constellation size Q.

In another related embodiment, the memory and the computer program code are further configured to, with the processor, cause the apparatus to employ a path reduction procedure to limit the most likely paths extending from the each node of the trellis or a path extension procedure to extend uncompleted paths of the trellis. Additionally, the log-sum of the number n of exponential terms is computed recursively using a Jacobean procedure. The log-sum of the number n of exponential terms may approximate a log-maximum a posteriori probability ("Log-MAP") procedure. Although the apparatus, method and system described herein have been described with respect to cellular-based communication systems, the apparatus and method are equally applicable to other types of communication systems such as a WiMax® communication system.

Program or code segments making up the various embodiments of the present invention may be stored in a computer readable medium or transmitted by a computer data signal embodied in a carrier wave, or a signal modulated by a carrier, over a transmission medium. For instance, a computer program product including a program code stored in a computer readable medium may form various embodiments of the present invention. The "computer readable medium" may include any medium that can store or transfer information. Examples of the computer readable medium include an electronic circuit, a semiconductor memory device, a read only memory ("ROM"), a flash memory, an erasable ROM ("EROM"), a floppy diskette, a compact disk ("CD")-ROM, an optical disk, a hard disk, a fiber optic medium, a radio frequency ("RF") link, and the like. The computer data signal may include any signal that can propagate over a transmission medium such as electronic communication network communication channels, optical fibers, air, electromagnetic links, RF links, and the like. The code segments may be downloaded via computer networks such as the Internet, Intranet, and the like.

As described above, the exemplary embodiment provides both a method and corresponding apparatus consisting of various modules providing functionality for performing the steps of the method. The modules may be implemented as hardware (embodied in one or more chips including an integrated circuit such as an application specific integrated circuit), or may be implemented as software or firmware for execution by a computer processor. In particular, in the case of firmware or software, the exemplary embodiment can be provided as a computer program product including a computer readable storage structure embodying computer program code (i.e., software or firmware) thereon for execution by the computer processor.

Although the present invention and its advantages have been described in detail, it should be understood that various changes, substitutions and alterations can be made herein without departing from the spirit and scope of the invention as defined by the appended claims. For example, many of the features and functions discussed above can be implemented in software, hardware, or firmware, or a combination thereof. Also, many of the features, functions steps of operating the same may be reordered, omitted, added, etc., and still fall within the broad scope of the present invention.

Moreover, the scope of the present application is not intended to be limited to the particular embodiments of the process, machine, manufacture, composition of matter, means, methods and steps described in the specification. As one of ordinary skill in the art will readily appreciate from the disclosure of the present invention, processes, machines, manufacture, compositions of matter, means, methods, or steps, presently existing or later to be developed, that perform substantially the same function or achieve substantially the same result as the corresponding embodiments described herein may be utilized according to the present invention. Accordingly, the appended claims are intended to include within their scope such processes, machines, manufacture, compositions of matter, means, methods, or steps.

What is claimed is:

1. An apparatus, comprising:
a processor; and
memory including computer program code,
said memory and said computer program code configured to, with said processor, cause said apparatus to perform at least the following:
construct a trellis representing a transmitted signal formed from a plurality of symbols transmitted by a number of transmit antennas, each symbol having a constellation size, said trellis being formed of columns representing said number of transmit antennas and rows representing values of said plurality of symbols with nodes at intersections thereof;
form a log likelihood ratio at said nodes of said trellis as a log-sum of a number of exponential terms corresponding to a hypothesized transmitted bit value of 0 or 1 of said plurality of symbols, said number of exponential terms being limited by a function of a number of most likely paths of said trellis extending from each node of said trellis and said constellation size; and
form a list at each node of said trellis of a size limited to said number of said most likely paths of said trellis extending from each node of said trellis.

2. The apparatus as recited in claim 1 wherein said memory and said computer program code are further configured to, with said processor, cause said apparatus to select a mostly likely symbol representing at least a portion of said transmitted signal from said lists of said most likely paths of said trellis.

3. The apparatus as recited in claim 1 wherein said memory and said computer program code are further configured to, with said processor, cause said apparatus to form path weights as a sum of edge weights along paths of said trellis as Euclidean distances dependent on said transmitted signal.

4. The apparatus as recited in claim 3 wherein said transmitted signal is received by a number of receive antennas over a communication channel as described by a channel matrix, wherein said path weights are formed employing a unitary-upper triangular decomposition of said channel matrix.

5. The apparatus as recited in claim 1 wherein said number of exponential terms is equal to constellation size times said number of said most likely paths of said trellis divided by two.

6. The apparatus as recited in claim 1 wherein said number of said most likely paths of said trellis is less than or equal to said constellation size.

7. The apparatus as recited in claim 1 wherein said memory and said computer program code are further configured to, with said processor, cause said apparatus to employ a path reduction procedure to limit said most likely paths extending from said each node of said trellis.

8. The apparatus as recited in claim 1 wherein said memory and said computer program code are further configured to, with said processor, cause said apparatus to employ a path extension procedure to extend uncompleted paths of said trellis.

9. The apparatus as recited in claim 1 wherein said log-sum of said number of exponential terms is computed recursively using a Jacobean procedure.

10. The apparatus as recited in claim 1 wherein said log-sum of said number of exponential terms approximates a log-maximum a posteriori probability (Log-MAP) procedure.

11. A computer program product comprising a program code stored in a non-transitory computer readable medium configured to:

construct a trellis representing a transmitted signal formed from a plurality of symbols transmitted by a number of transmit antennas, each symbol having a constellation size, said trellis being formed of columns representing said number of transmit antennas and rows representing values of said plurality of symbols with nodes at intersections thereof;

form a log likelihood ratio at said nodes of said trellis as a log-sum of a number of exponential terms corresponding to a hypothesized transmitted bit value of 0 or 1 of said plurality of symbols, said number of exponential terms being limited by a function of a number of most likely paths of said trellis extending from each node of said trellis and said constellation size; and form a list at each node of said trellis of a size limited to said number of said most likely paths of said trellis extending from each node of said trellis.

12. The computer program product as recited in claim 11 wherein said program code stored in said non-transitory computer readable medium is configured to select a mostly likely symbol representing at least a portion of said transmitted signal from said lists of said most likely paths of said trellis.

13. A method, comprising:

constructing via a processor, a trellis representing a transmitted signal formed from a plurality of symbols transmitted by a number of transmit antennas, each symbol having a constellation size, said trellis being formed of columns representing said number of transmit antennas and rows representing values of said plurality of symbols with nodes at intersections thereof;

forming via the processor, a log likelihood ratio at said nodes of said trellis as a log-sum of a number of exponential terms corresponding to a hypothesized transmitted bit value of 0 or 1 of said plurality of symbols, said number of exponential terms being limited by a function of a number of most likely paths of said trellis extending from each node of said trellis and said constellation size; and forming via the processor, a list at each node of said trellis of a size limited to said number of said most likely paths of said trellis extending from each node of said trellis.

14. The method as recited in claim 13 further comprising selecting via the processor, a mostly likely symbol representing at least a portion of said transmitted signal from said lists of said most likely paths of said trellis.

15. The method as recited in claim 13 further including forming path weights as a sum of edge weights along paths of said trellis as Euclidean distances dependent on said transmitted signal.

16. The method as recited in claim 15 wherein said transmitted signal is received by a number of receive antennas over a communication channel as described by a channel matrix, wherein said path weights are formed employing a unitary-upper triangular decomposition of said channel matrix.

17. The method as recited in claim 13 wherein said number of exponential terms is equal to constellation size times said number of said most likely paths of said trellis divided by two.

18. The method as recited in claim 13 wherein said number of said most likely paths of said trellis is less than or equal to said constellation size.

19. The method as recited in claim 13 further comprising employing via the processor, a path reduction procedure to limit said most likely paths extending from said each node of said trellis.

20. The method as recited in claim 13 further comprising employing via the processor, a path extension procedure to extend uncompleted paths of said trellis.

* * * * *